(12) United States Patent
Mundarath et al.

(10) Patent No.: US 9,843,346 B1
(45) Date of Patent: Dec. 12, 2017

(54) DIGITAL PREDISTORTION FOR A POWER AMPLIFIER AND METHOD THEREFOR

(71) Applicant: FREESCALE SEMICONDUCTOR, INC., Austin, TX (US)

(72) Inventors: Jayakrishnan Cheriyath Mundarath, Austin, TX (US); Mir Masood, Mesa, AZ (US); Peter Zahariev Rashev, Calgary (CA)

(73) Assignees: NXP USA, Inc.; Angie Zalewski

( * ) Notice: Subject to any disclaimer, the term of this patent is extended or adjusted under 35 U.S.C. 154(b) by 0 days.

(21) Appl. No.: 15/222,735

(22) Filed: Jul. 28, 2016

(51) Int. Cl.
| | |
|---|---|
| H03L 5/00 | (2006.01) |
| H03K 5/08 | (2006.01) |
| H04L 25/49 | (2006.01) |
| H04B 1/04 | (2006.01) |
| H04L 27/26 | (2006.01) |
| H03F 1/32 | (2006.01) |

(52) U.S. Cl.
CPC ............ H04B 1/0475 (2013.01); H03F 1/32 (2013.01); H03F 1/3241 (2013.01); H04L 27/2614 (2013.01); H04B 2001/0408 (2013.01); H04B 2001/0425 (2013.01)

(58) Field of Classification Search
USPC ........................ 375/219, 220, 240, 229–236, 375/240.26–240.27, 254, 285, 284, 278, 375/295, 296, 316, 318, 319, 322, 324, 375/340, 346, 348, 349; 327/306, 317, 327/331, 332, 311, 309, 323, 329, 330, 327/324
See application file for complete search history.

(56) References Cited

U.S. PATENT DOCUMENTS

| | | |
|---|---|---|
| 6,304,140 B1 | 10/2001 | Thron et al. |
| 8,068,574 B2 | 11/2011 | Norris et al. |
| 8,537,041 B2 | 9/2013 | Vella-Coleiro et al. |
| 9,130,628 B1 | 9/2015 | Mittal et al. |
| 9,252,821 B2 | 2/2016 | Shor et al. |
| 9,325,357 B2 | 4/2016 | Volokhine et al. |

(Continued)

OTHER PUBLICATIONS

Al, B. et al., "Novel Pre-Distortion of Power Amplifier with Proposed Fractional Order Memory Polynomial", 2011 IEEE Global Telecommunications Conference, pp. 1-6.

(Continued)

*Primary Examiner* — Linda Wong
(74) *Attorney, Agent, or Firm* — Daniel D. Hill

(57) ABSTRACT

A digital frontend circuit for a radio frequency (RF) comprises a digital predistortion (DPD) block, a plurality of sub-sample delay elements, and a selection circuit. The DPD block for computing predistorted transmit signals according to a Volterra series approximation model. The DPD block has an input for receiving input samples at a first sample rate and an output for providing the predistorted transmit signals at the first sample rate. Each of the sub-sample delay elements provides a delay to an input sample as specified by the Volterra series approximation model, where each of the delays is based on a fraction of the first sample rate. The selection circuit selects one of the plurality of sub-sample delay elements in response to a selection signal from the digital predistortion block. The selection signal for selecting a delay as specified by the Volterra series approximation model.

19 Claims, 3 Drawing Sheets

(56) References Cited

U.S. PATENT DOCUMENTS

2012/0176190 A1* 7/2012 Goodman ........... H03M 1/1052
327/551
2013/0034188 A1* 2/2013 Rashev ............. H04L 25/03063
375/297

OTHER PUBLICATIONS

Hermanowicz, E., "Self-Adjusting Sub-Sample Delay Estimator Based on Fractional Delaying Hilbert Transform Filter", New Trends in Audio and Video/Signal Processing Algorithms, Architectures, Arrangements, and Applications SPA 2008, 5 pages.

Zhou, D. et al., "Efficient Adaptive Volterra Filters for Active Nonlinear Noise Control with a Linear Secondary-Path", Proceedings of the 2004 International Symposium on Circuits and Systems, 2004, vol. 3, pp. 297-300.

Zenteno, E. et al., "Multiple-input multiple-output symbol rate signal digital predistorter for non-linear multi-carrier satellite channels", IET Communications, vol. 9, Issue 16, 2015, pp. 2053-2059.

\* cited by examiner

DIGITAL PREDISTORTION FOR A POWER AMPLIFIER AND METHOD THEREFOR

BACKGROUND

Field

This disclosure relates generally to communications circuits and more specifically to digital predistortion (DPD) for a power amplifier (PA) and method therefor.

Related Art

Growing demand of high data rates and exponential growth of wireless subscribers has led to the widespread use of spectrum efficient complex modulation schemes with high peak to average ratio (PAPR) and wideband signal bandwidth. These complex modulation schemes pose significant challenge for the linearization techniques for radio frequency (RF) power amplifiers.

Digital predistortion (DPD) is a widely used PA linearization technique that allows improving the efficiency of the PA by reducing the backoff while meeting the required linearity conditions like spectrum emission mask (SEM) and adjacent channel power (ACP) specifications.

Modern complex modulation schemes with high signal PAPR and large bandwidths pose significant challenge on the performance of a DPD system. The performance of a DPD system can be enhanced by using higher sampling rates; however, minimizing the complexity cost can be a challenge.

Therefore, a need exists for a DPD scheme that provides increased performance with minimal increase in complexity.

BRIEF DESCRIPTION OF THE DRAWINGS

The present invention is illustrated by way of example and is not limited by the accompanying figures, in which like references indicate the same or similar elements between the various embodiments. Elements in the figures are illustrated for simplicity and clarity and have not necessarily been drawn to scale.

DETAILED DESCRIPTION

Figure 1:
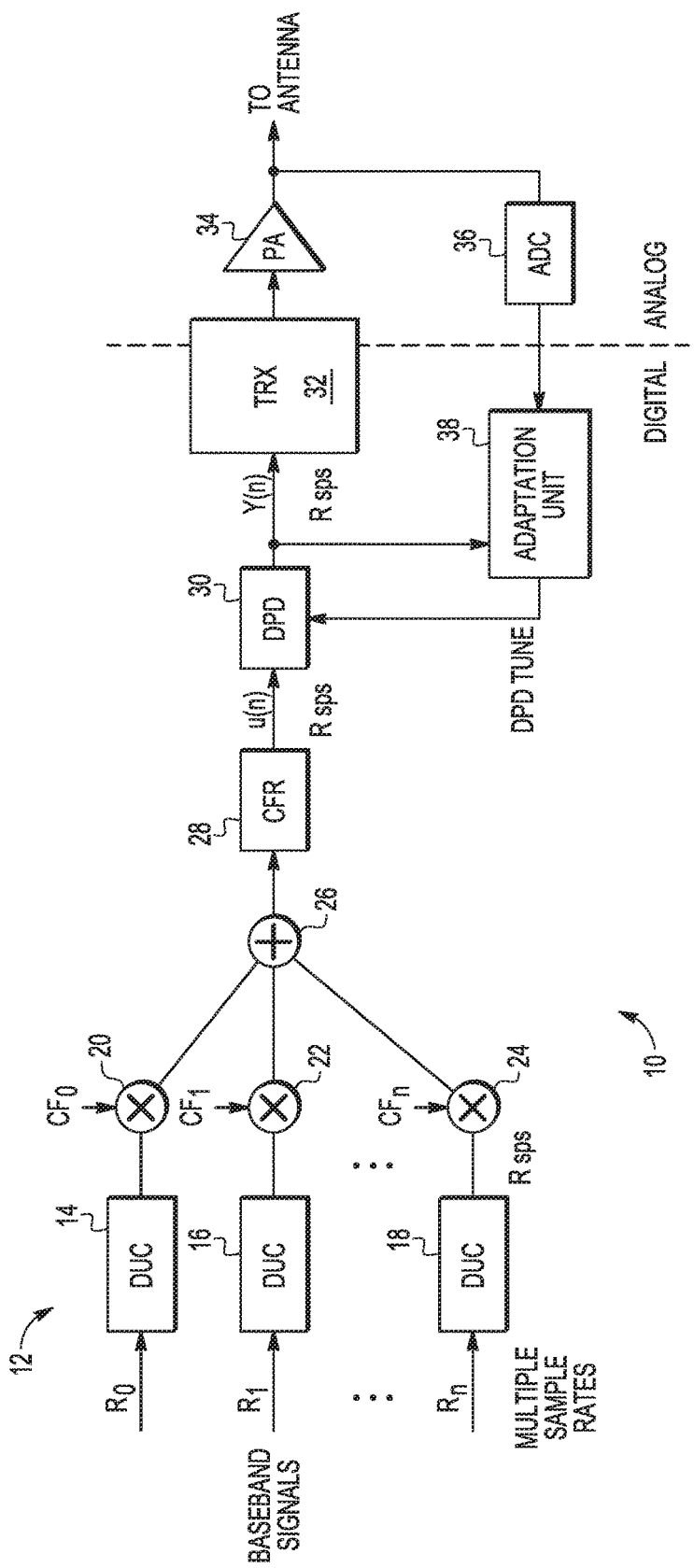
FIG. 1 illustrates, in block diagram form, a digital frontend for a transmitter incorporating digital predistortion in accordance with an embodiment.

Generally, there is provided, a DPD approach based on the Volterra series approximation having a plurality of sub-sample delay elements, each sub-sample delay element providing a selectable fractional delay. Only the fractional delays needed by the model are computed. Each sub-sample delay element includes a FIR filter and storage. The fractional delays are determined based on the Volterra series approximation model of the output signal of a power amplifier. The DPD block provides a predistorted input signal to the power amplifier to achieve linearization for the power amplifier. The described DPD approach achieves performance equivalent to a conventional approach having a higher sampling rate, and provides the equivalent performance with lower complexity and fewer computations. Also, the techniques described herein apply to any DPD algorithm or scheme.

In one embodiment, there is provided, a digital frontend circuit for a radio frequency (RF) transmitter, the digital frontend circuit comprising: a digital predistortion block for computing predistorted transmit signals according to a Volterra series approximation model, the digital predistortion block having an input for receiving input samples at a first sample rate and an output for providing the predistorted transmit signals at the first sample rate; a plurality of sub-sample delay elements, each of the sub-sample delay elements for providing a delay to an input sample as specified by the Volterra series approximation model, each of the delays based on a fraction of the first sample rate; and a selection circuit coupled to the digital predistortion block and to the plurality of sub-sample delay elements, the selection circuit selecting one of the plurality of sub-sample delay elements in response to a selection signal from the digital predistortion block, the selection signal for selecting a delay as specified by the Volterra series approximation model. The Volterra series approximation model may be computed as $$y(n) = \sum_{\{r,q\} \in S} u(n - r/M) P_{r,q}(|u(n - q/M)|)$$

where u(m) represents complex input samples, M is an integer, y(n) represents complex pre-distorted output samples, set S is a set of integer delay pairs {r, q}, and polynomial function $P_{r,q}(\ )$ has a distinct order and coefficients for each unique {r,q} pair. Each sub-sample delay element of the plurality of sub-sample delay elements may include a filter. The digital predistortion block may be implemented using a vector processor. The digital frontend circuit may further comprise a power amplifier having an input coupled to the output of the digital predistortion block, and an output; and an adaptation unit having an input coupled to the output of the power amplifier, and an output for providing digital predistortion parameters to the digital predistortion block. The digital frontend circuit may further comprise: a plurality of digital up conversion circuits, each of the plurality of digital up conversion circuits having an input for receiving one of a plurality of samples, each of the plurality of samples having a different sample rate, and an output for providing the plurality of samples at the first sample rate; a plurality of mixers, each of the plurality of mixers having a first input coupled to a corresponding one of the plurality of digital up conversion circuits, a second input for receiving a sinusoidal signal, and an output; a combining element having an input coupled to the outputs of each of the plurality of mixers, and an output for providing a composite signal; and a crest factor reduction circuit having an input coupled to the output of the combining element, and an output coupled to the input of the predistortion block. The digital frontend circuit is implemented on a single integrated circuit.

In another embodiment, there is provided, a digital frontend circuit for a radio frequency (RF) transmitter, the digital frontend circuit comprising: a digital predistortion block for computing predistorted transmit signals according to a Volterra series approximation model, the digital predistortion block having an input for receiving input samples at a first sample rate and an output for providing the predistorted transmit signals at the first sample rate; a plurality of sub-sample delay elements, each of the sub-sample delay elements for providing a delay to an input sample as specified by the Volterra series approximation model, each of the delays based on a fraction of the first sample rate; a selection circuit coupled to the digital predistortion block and to the plurality of sub-sample delay elements, the selection circuit selecting one of the plurality of sub-sample delay elements in response to a selection signal from the digital predistortion block, the selection signal for selecting a delay as specified by the Volterra series approximation model; a power amplifier having an input coupled to the output of the digital predistortion block, and an output; and an adaptation unit having an input coupled to the output of the power amplifier, and an output for providing a tuning signal to the digital predistortion block in response to changes in the output of the power amplifier. The Volterra series approximation model may be computed as $$y(n) = \sum_{\{r,q\} \in S} u(n - r/M) P_{r,q}(|u(n - q/M)|)$$

where u(m) represents complex input samples, M is a integer, y(n) represents complex pre-distorted output samples, set S is a set of integer delay pairs {r, q}, and polynomial function $P_{r,q}(\ )$ has a distinct order and coefficients for each unique {r,q} pair. Each sub-sample delay element of the plurality of sub-sample delay elements may include a filter. The digital predistortion block may be implemented using a vector processor. The digital frontend circuit of claim 8 may further comprise: a plurality of digital up conversion circuits, each of the plurality of digital up conversion circuits having an input for receiving one of a plurality of samples, each of the plurality of samples having a different sample rate, and an output for providing the plurality of samples at the first sample rate; a plurality of mixers, each of the plurality of mixers having a first input coupled to a corresponding one of the plurality of digital up conversion circuits, a second input for receiving a sinusoidal signal, and an output; a combining element having an input coupled to the outputs of each of the plurality of mixers, and an output for providing a composite signal; and a crest factor reduction circuit having an input coupled to the output of the combining element, and an output coupled to the input of the predistortion block. The digital frontend circuit may be implemented on a single integrated circuit.

In yet another embodiment, there is provided, a method of digital predistortion for a power amplifier according to a Volterra series approximation model, the method comprising: computing sub-sample fractional delay signals of an input, wherein the sub-sample fractional delay signals are computed at a fraction of an input sample rate; calculating polynomials for all terms in the Volterra series approximation model; storing polynomial calculation results in memory; multiplying the polynomial calculation results with sub-sample fractionally delayed inputs and accumulate the results of multiplying; and storing the accumulated results. The Volterra series approximation model may be computed as $$y(n) = \sum_{\{r,q\} \in S} u(n - r/M) P_{r,q}(|u(n - q/M)|)$$

where u(m) represents complex input samples, M is a integer, y(n) represents complex pre-distorted output samples, set S is a set of integer delay pairs {r, q}, and polynomial function $P_{r,q}(\ )$ has a distinct order and coefficients for each unique {r,q} pair. Computing sub-sample fractional delay signals may further comprise using a plurality of sub-sample delay elements, wherein each of the plurality of sub-sample delay elements provides a different delay based on the fraction of the first sample rate. The method may be implemented as software in a vector processor. The vector processor may be one of a plurality of vector processors implemented on a single integrated circuit. Storing the accumulated results may further comprise storing the accumulated results in a random access memory on the single integrated circuit. Computing sub-sample fractional delay signals may comprise computing sub-sample fraction delay signals only if required by the Volterra series approximation model.

FIG. 1 illustrates, in block diagram form, a digital frontend 10 for a transmitter incorporating DPD in accordance with an embodiment. In one embodiment, digital frontend 10 is implemented on a single integrated circuit. Digital frontend 10 includes digital up conversion (DUC) block 12, crest factor reduction (CFR) block 28, digital predistortion block 30, transceiver (TRX) 32, power amplifier (PA) 34, analog-to-digital converter (ADC) 36, and adaptation unit 38. Digital up conversion block 12 includes a plurality of DUC elements represented by DUC elements 14, 16, and 18, mixers 20, 22, and 24, and combining element 26. A vertical dashed line marks the demarcation between digital circuitry on the left side and analog circuitry on the right side of the dashed line. Note that the dashed line goes through transceiver 32 indicating that part of transceiver 32 is digital and part is analog.

In digital frontend 10, a plurality of baseband signals labeled R0-Rn are provided to inputs of each of the DUC elements 14, 16, and 18. Each of the input baseband signals can have a different sample rate. The DUC elements up sample the baseband signals and provides output signals having a uniform output sample rate equal to R samples per second (sps). Mixers 20, 22, and 24 mix the DUC output signals with CF0-CFn, that are complex sinusoids corresponding to the center frequency of each respective carrier. The outputs of mixers 20, 22, and 24 are provided to a combining element 26. In the illustrated embodiment, combining element 26 is an adder and provides a composite signal to an input of CFR 28. Crest factor reduction block 28 provides a signal labeled u(n) having a base sample rate R sps to DPD block 30. Digital predistortion block 30 will be described in more detail below. A predistorted transmit signal Y(n) from outputs of DPD 30 are provided to transceiver 32. Output Y(n) is predistorted based on the Volterra series approximation model to compensate for the non-linearities of the power amplifier and memory effects. Transceiver 32 has an output connected to an input of PA 34. Power amplifier 34 is a conventional power amplifier. An output of PA 34 is connected to an antenna (not shown). Analog-to-digital converter 36 has an input connected to the output of PA 34, and an output. Adaptation unit 38 has an input connected to the output of ADC 36, and an output for providing DPD TUNING signal to a control input of DPD 30. The DPD TUNING signal comprises, for example, DPD parameters. Adaptation unit 38 monitors the output of PA 34 and controls the predistortion model of DPD block 30 in response to changes in the output of PA 34. For example, non-linearities in the output signal of PA 34 may change due to, for example, changing operating conditions such as changing temperature.

Figure 2:
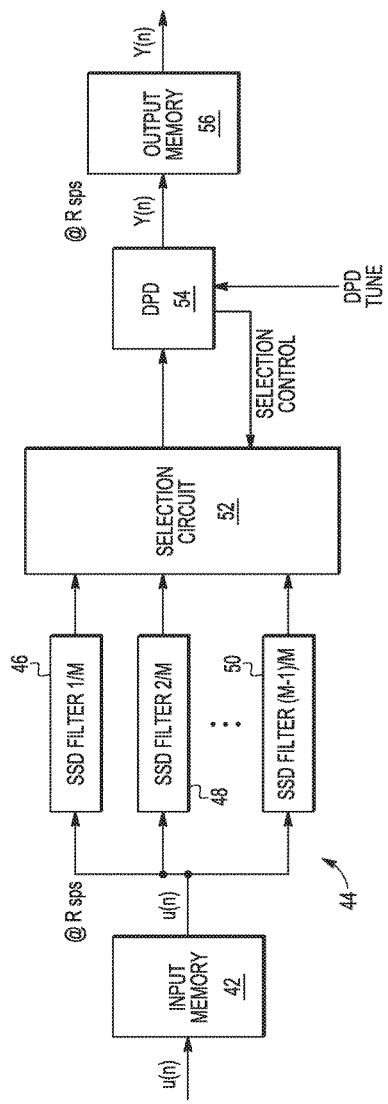
FIG. 2 illustrates, in block diagram form, the digital predistortion block of the digital frontend of FIG. 1 in more detail.

FIG. 2 illustrates, in block diagram form, DPD block 30 of the digital frontend of FIG. 1 in more detail. Digital predistortion block 30 include input memory 42, plurality of sub-sample delay (SSD) storage elements 44, selection circuit 52, DPD 54, and output memory 56. The plurality of SSD storage elements 44 includes representative SSD filter storage elements 46, 48, and 50. Each of the SSD filter storage elements includes a filter function. In the described embodiment, the filter is characterized as being a finite impulse response (FIR) filter. In other embodiments, the type of filter may be different.

Input memory 42 is a conventional random access memory that receives input samples labeled u(n) from CFR block 28 and functions as a buffer for DPD block 30. Memory 42 is coupled to inputs of the plurality of sub-sample delay storage elements 44 for providing the buffered input samples u(n). Each of the SSD storage elements 46, 48, and 50 provides a delay that is determined by DPD block 54 in response to the DPD TUNE signal from adaptation unit 38. In accordance with the illustrated embodiment, the delay is not limited to integers but can be a fractional delay. For example, as illustrated in FIG. 2, SSD delay storage element 46 provides a fractional delay equal to 1/M, where M is an integer. Likewise, SSD delay storage element 48 provides a fractional delay of 2/M, and SSD delay storage element 50 provides a fractional delay of (M−1)/M. The particular delay is determined by the DPD model in DPD 54. Digital predistortion block 54 selects the appropriate SSD delay element using a selection control signal SELECTION CONTROL provided to selection circuit 52. In one embodiment, selection circuit 52 is a multiplexer. In another embodiment, the selection is done in software. Digital predistortion block 54 receives the delayed signals from selection circuit 52 for use in calculating the digital predistorter output, and provides the results Y(n) at sample rate R sps to output memory 56. Output memory 56 may be the same memory as input memory 42, or it may be different. The functional elements illustrated in FIG. 2 may be implemented in one or more processing elements such as a field programmable gate array (FPGA) or in a processor such as a vector processor.

A conventional DPD model based on Volterra series approximation is equation 1:

$$y(n) = \sum_{\{r,q\} \in S} x(n-r) P_{r,q}(|x(n-q)|)$$

where x(n) represents complex input samples at a transceiver interface rate (base rate), at a discrete time n, where y(n) represents complex pre-distorted output samples at output sample rate R at discrete time n, set S is a set of integer delay pairs {r, q}, and polynomial function $P_{r,q}(\ )$ has a distinct order and coefficients for each unique {r,q} pair. The set S and the corresponding polynomial functions are defined based on measured PA characteristics. The conventional approach to improving DPD performance using the equation above is to use a higher sampling rate. However, typical DPD functions are very computationally intensive and increasing the sampling rate increases the complexity so that larger DPD models may become very computationally expensive to build.

A Volterra model in accordance with an embodiment is equation 2:

$$y(n) = \sum_{\{r,q\} \in S} u(n-r/M) P_{r,q}(|u(n-q/M)|)$$

where u(m) represents complex input samples at an interpolated rate of R*M and at a fractional discrete time m, where m=n+/−k/M, and where k is an integer and k<M. The output samples at base rate R is y(n), where y(n) represents complex pre-distorted output samples, set S is a set of integer delay pairs {r, q}, and polynomial function $P_{r,q}(\ )$ has a distinct order and coefficients for each unique {r,q} pair. The set S and the corresponding polynomial function are defined based on measured PA characteristics. The values of r and q can be selected to define certain time offsets and can be larger than M and R, and not necessarily a multiple of M and R. A time domain resolution of equation 2 is 1/(R*M). That is, the time domain resolution is M times better than what is provided at the output sample rate R. The $P_{r,q}(\ )$ polynomial function has the flexibility to include terms that do not have consecutive powers, such as powers that sparse in the arithmetic progression, for example, resulting in even, odd or quadratic array of terms. In one embodiment, the calculations are performed using one or more software based vector processors (not shown).

Using the DPD model having fractional delays in accordance with the illustrated embodiment achieves DPD performance equivalent to using the conventional DPD model at an increased sample rate, but DPD block 30 has lower complexity. Also, DPD block 30 provides the advantage that only the sub-samples that are needed for the model are computed because they are selected by DPD 54 while the calculations are being performed. In addition, the sample rate at the input and output of DPD block 54 is the same as illustrated in FIG. 1, eliminating the need for interpolators and decimators.

Figure 3:
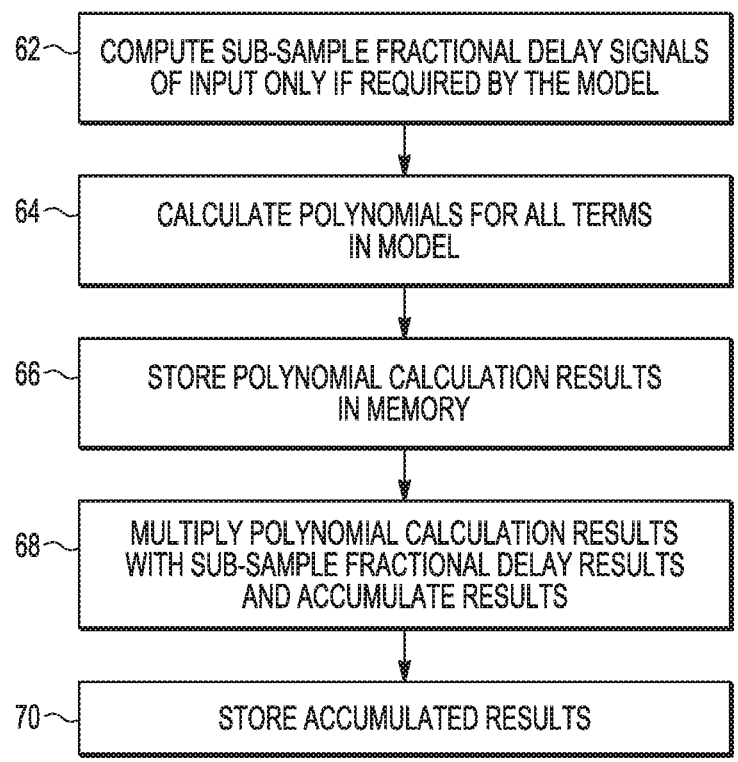
FIG. 3 illustrates a flowchart of a method of digital predistortion in accordance with an embodiment.

FIG. 3 illustrates a flowchart of a method 60 for providing digital predistortion in accordance with an embodiment. At step 62, sub-sample fractional delay signals from SSD filter elements 46, 48, and 50 are computed for the input samples only if they are required by the model (equation 2 above), thus saving computation time. The flexibility to select only SSD filter elements required by the model is software controlled. At step 64, the polynomials $P_{r,q}(\ )$ of the model are calculated for all terms in the model. At step 66, the calculated terms are stored in a memory, such as memory 42 or memory 56. At step 68, the polynomial calculation results from step 64 are multiplied with corresponding sub-sample fractional delayed inputs and the results accumulated. At step 70, the accumulated results are stored until they are applied to PA 34. Method 60 may be implemented as software to be run on a vector processor. The vector processor may be one of several vector processors on a system-on-a-chip (SoC) integrated circuit for implementing digital frontend circuit 10. The software may be stored in a non-transitory storage medium.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A digital frontend circuit for a radio frequency (RF) transmitter, the digital frontend circuit comprising:
   a digital predistortion block for computing predistorted transmit signals according to a Volterra series approximation model, the digital predistortion block having an input for receiving input samples at a first sample rate and an output for providing the predistorted transmit signals at the first sample rate;
   a plurality of sub-sample delay elements, each of the sub-sample delay elements for providing a delay to an input sample as specified by the Volterra series approximation model, each of the delays provided by each of the sub-sample delay elements is based on a fraction of the first sample rate; and
   a selection circuit coupled to the digital predistortion block and to the plurality of sub-sample delay elements, the selection circuit selecting one of the plurality of sub-sample delay elements in response to a selection signal from the digital predistortion block, the selection signal for selecting a delay as specified by the Volterra series approximation model.

2. The digital frontend circuit of claim 1, wherein the Volterra series approximation model is computed as $$y(n) = \sum_{[r,q] \in S} u(n - r/M) P_{r,q}(|u(n - q/M)|)$$

where u(m) represents complex input samples, n is a discrete time, m=n+/−k/M and where k is an integer and k<M, M is an integer, y(n) represents complex pre-distorted output samples, set S is a set of integer delay pairs {r, q}, and polynomial function $P_{r,q}( )$ has a distinct order and coefficients for each unique {r,q} pair.

3. The digital frontend circuit of claim 1, wherein each sub-sample delay element of the plurality of sub-sample delay elements includes a filter.

4. The digital frontend circuit of claim 1, wherein the digital predistortion block is implemented using a vector processor.

5. The digital frontend circuit of claim 1, further comprising:
   a power amplifier having an input coupled to the output of the digital predistortion block, and an output; and
   an adaptation unit having an input coupled to the output of the power amplifier, and an output for providing digital predistortion parameters to the digital predistortion block.

6. The digital frontend circuit of claim 1 further comprising:
   a plurality of digital up conversion circuits, each of the plurality of digital up conversion circuits having an input for receiving one of a plurality of samples, each of the plurality of samples having a different sample rate, and an output for providing the plurality of samples at the first sample rate;
   a plurality of mixers, each of the plurality of mixers having a first input coupled to a corresponding one of the plurality of digital up conversion circuits, a second input for receiving a sinusoidal signal, and an output;
   a combining element having an input coupled to the outputs of each of the plurality of mixers, and an output for providing a composite signal; and
   a crest factor reduction circuit having an input coupled to the output of the combining element, and an output coupled to the input of the predistortion block.

7. The digital frontend circuit of claim 1, wherein the digital frontend circuit is implemented on a single integrated circuit.

8. A digital frontend circuit for a radio frequency (RF) transmitter, the digital frontend circuit comprising:
   a digital predistortion block for computing predistorted transmit signals according to a Volterra series approximation model, the digital predistortion block having an input for receiving input samples at a first sample rate and an output for providing the predistorted transmit signals at the first sample rate;
   a plurality of sub-sample delay elements, each of the sub-sample delay elements for providing a delay to an input sample as specified by the Volterra series approximation model, each of the delays provided by each of the sub-sample delay elements is based on a fraction of the first sample rate;
   a selection circuit coupled to the digital predistortion block and to the plurality of sub-sample delay elements, the selection circuit selecting one of the plurality of sub-sample delay elements in response to a selection signal from the digital predistortion block, the selection signal for selecting a delay as specified by the Volterra series approximation model;
   a power amplifier having an input coupled to the output of the digital predistortion block, and an output; and
   an adaptation unit having an input coupled to the output of the power amplifier, and an output for providing a tuning signal to the digital predistortion block in response to changes in the output of the power amplifier.

9. The digital frontend circuit of claim 8, wherein the Volterra series approximation model is computed as $$y(n) = \sum_{\{r,q\} \in S} u(n - r/M) P_{r,q}(|u(n - q/M)|)$$

where u(m) represents complex input samples, n is a discrete time, m=n+/−k/M, k is an integer and k<M, M is a integer, y(n) represents complex pre-distorted output samples, set S is a set of integer delay pairs {r, q}, and polynomial function $P_{r,q}(\ )$ has a distinct order and coefficients for each unique {r,q} pair.

10. The digital frontend circuit of claim 8, wherein each sub-sample delay element of the plurality of sub-sample delay elements includes a filter.

11. The digital frontend circuit of claim 8, wherein the digital predistortion block is implemented using a vector processor.

12. The digital frontend circuit of claim 8 further comprising:
   a plurality of digital up conversion circuits, each of the plurality of digital up conversion circuits having an input for receiving one of a plurality of samples, each of the plurality of samples having a different sample rate, and an output for providing the plurality of samples at the first sample rate;
   a plurality of mixers, each of the plurality of mixers having a first input coupled to a corresponding one of the plurality of digital up conversion circuits, a second input for receiving a sinusoidal signal, and an output;
   a combining element having an input coupled to the outputs of each of the plurality of mixers, and an output for providing a composite signal; and
   a crest factor reduction circuit having an input coupled to the output of the combining element, and an output coupled to the input of the predistortion block.

13. The digital frontend circuit of claim 8, wherein the digital frontend circuit is implemented on a single integrated circuit.

14. A method of digital predistortion for a power amplifier according to a Volterra series approximation model, the method comprising:
   computing sub-sample fractional delay signals of an input, wherein the sub-sample fractional delay signals are computed at a fraction of an input sample rate, and wherein only the sub-sample fractional delay signals required by the Volterra series approximation model are selected to be computed;
   calculating polynomials for all terms in the Volterra series approximation model, wherein the Volterra series approximation model is computed as $$y(n) = \sum_{\{r,q\} \in S} u(n - r/M) P_{r,q}(|u(n - q/M)|)$$

where u(m) represents complex input samples, n is a discrete time, m=n+/−k/M, k is an integer and k<M, M is a integer, y(n) represents complex pre-distorted output samples, set S is a set of integer delay pairs {r, q}, and polynomial function $P_{r,q}(\ )$ has a distinct order and coefficients for each unique {r,q} pair;
   storing polynomial calculation results in memory;
   multiplying the polynomial calculation results with sub-sample fractionally delayed inputs and accumulate the results of multiplying; and
   storing the accumulated results.

15. The method of claim 14, wherein computing sub-sample fractional delay signals further comprises using a plurality of sub-sample delay elements, wherein each of the plurality of sub-sample delay elements provides a different delay based on the fraction of the first sample rate.

16. The method of claim 14, wherein the method is implemented as software in a vector processor.

17. The method of claim 16, wherein the vector processor is one of a plurality of vector processors implemented on a single integrated circuit.

18. The method of claim 17, wherein storing the accumulated results further comprises storing the accumulated results in a random access memory on the single integrated circuit.

19. The method of claim 14, wherein computing sub-sample fractional delay signals comprises computing sub-sample fractional delay signals only if required by the Volterra series approximation model.

* * * * *